United States Patent
Lii et al.

(10) Patent No.: US 11,594,484 B2
(45) Date of Patent: Feb. 28, 2023

(54) FORMING BONDING STRUCTURES BY USING TEMPLATE LAYER AS TEMPLATES

(71) Applicant: Taiwan Semiconductor Manufacturing Co., Ltd., Hsinchu (TW)

(72) Inventors: Mirng-Ji Lii, Sinpu Township (TW); Chung-Shi Liu, Hsinchu (TW); Chin-Yu Ku, Hsinchu (TW); Hung-Jui Kuo, Hsinchu (TW); Alexander Kalnitsky, San Francisco, CA (US); Ming-Che Ho, Tainan (TW); Yi-Wen Wu, Xizhi (TW); Ching-Hui Chen, Hsinchu (TW); Kuo-Chio Liu, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 209 days.

(21) Appl. No.: 16/915,312

(22) Filed: Jun. 29, 2020

(65) Prior Publication Data
US 2020/0328153 A1  Oct. 15, 2020

Related U.S. Application Data

(60) Continuation of application No. 15/942,762, filed on Apr. 2, 2018, now Pat. No. 10,700,001, which is a
(Continued)

(51) Int. Cl.
*H01L 23/48* (2006.01)
*H01L 23/522* (2006.01)
(Continued)

(52) U.S. Cl.
CPC ........ *H01L 23/5226* (2013.01); *H01L 21/486* (2013.01); *H01L 21/76808* (2013.01);
(Continued)

(58) Field of Classification Search
None
See application file for complete search history.

(56) References Cited

U.S. PATENT DOCUMENTS

5,538,922 A  7/1996  Cooper et al.
5,872,373 A  2/1999  Itoh
(Continued)

FOREIGN PATENT DOCUMENTS

DE  10227663 A1  1/2004
DE  102006056066 A1  6/2007
(Continued)

*Primary Examiner* — Bilkis Jahan
(74) *Attorney, Agent, or Firm* — Slater Matsil, LLP

(57) ABSTRACT

A method includes forming a first dielectric layer over a conductive pad, forming a second dielectric layer over the first dielectric layer, and etching the second dielectric layer to form a first opening, with a top surface of the first dielectric layer exposed to the first opening. A template layer is formed to fill the first opening. A second opening is then formed in the template layer and the first dielectric layer, with a top surface of the conductive pad exposed to the second opening. A conductive pillar is formed in the second opening.

20 Claims, 20 Drawing Sheets

Related U.S. Application Data division of application No. 14/885,719, filed on Oct. 16, 2015, now Pat. No. 9,935,047.

(51) Int. Cl.

| | | |
|---|---|---|
| *H01L 23/31* | (2006.01) | |
| *H01L 23/00* | (2006.01) | |
| *H01L 21/48* | (2006.01) | |
| *H01L 21/768* | (2006.01) | |
| *H01L 23/528* | (2006.01) | |
| *H01L 23/532* | (2006.01) | |

(52) U.S. Cl.

CPC .... *H01L 21/76877* (2013.01); *H01L 23/3192* (2013.01); *H01L 23/528* (2013.01); *H01L 24/02* (2013.01); *H01L 24/05* (2013.01); *H01L 24/11* (2013.01); *H01L 24/13* (2013.01); *H01L 24/16* (2013.01); *H01L 24/81* (2013.01); *H01L 23/5329* (2013.01); *H01L 23/53295* (2013.01); *H01L 24/94* (2013.01); *H01L 2224/0235* (2013.01); *H01L 2224/02313* (2013.01); *H01L 2224/02321* (2013.01); *H01L 2224/02331* (2013.01); *H01L 2224/0401* (2013.01); *H01L 2224/05008* (2013.01); *H01L 2224/05548* (2013.01); *H01L 2224/05557* (2013.01); *H01L 2224/1147* (2013.01); *H01L 2224/11462* (2013.01); *H01L 2224/11464* (2013.01); *H01L 2224/131* (2013.01); *H01L 2224/13021* (2013.01); *H01L 2224/13022* (2013.01); *H01L 2224/13024* (2013.01); *H01L 2224/13082* (2013.01); *H01L 2224/13111* (2013.01); *H01L 2224/13144* (2013.01); *H01L 2224/13147* (2013.01); *H01L 2224/13155* (2013.01); *H01L 2224/13157* (2013.01); *H01L 2224/13164* (2013.01); *H01L 2224/1601* (2013.01); *H01L 2224/16111* (2013.01); *H01L 2224/16112* (2013.01); *H01L 2224/16145* (2013.01); *H01L 2224/16227* (2013.01); *H01L 2224/94* (2013.01); *H01L 2225/06513* (2013.01)

(56) References Cited

U.S. PATENT DOCUMENTS

| | | | |
|---|---|---|---|
| 6,475,810 B1 | 11/2002 | Zhou et al. | |
| 6,548,401 B1 | 4/2003 | Trivedi | |
| 6,586,842 B1 | 6/2003 | You et al. | |
| 7,402,515 B2 * | 7/2008 | Arana | H01L 21/76898 257/E21.597 |
| 7,482,703 B2 | 1/2009 | Hwang et al. | |
| 7,838,424 B2 | 11/2010 | Karta et al. | |
| 7,863,742 B2 | 1/2011 | Yu et al. | |
| 7,932,601 B2 | 4/2011 | Chang et al. | |
| 8,421,193 B2 * | 4/2013 | Huang | H01L 24/92 438/455 |
| 8,754,508 B2 | 6/2014 | Chen et al. | |
| 8,772,151 B2 | 7/2014 | Chen | |
| 8,846,548 B2 | 9/2014 | Tu et al. | |
| 9,373,543 B1 * | 6/2016 | Mont | H01L 21/76816 |
| 9,935,047 B2 * | 4/2018 | Lii | H01L 23/5226 |
| 2002/0123219 A1 | 9/2002 | Laverty et al. | |
| 2003/0234436 A1 | 12/2003 | Hsu et al. | |
| 2005/0184359 A1 | 8/2005 | Akatsu et al. | |
| 2006/0042952 A1 * | 3/2006 | Oliver | H01L 21/76898 257/E21.597 |
| 2007/0082475 A1 | 4/2007 | Park | |
| 2011/0031603 A1 | 2/2011 | Su et al. | |
| 2011/0171827 A1 * | 7/2011 | Farooq | H01L 23/481 438/653 |
| 2011/0215464 A1 | 9/2011 | Guzek et al. | |
| 2012/0013022 A1 | 1/2012 | Sabuncuoglu Tezcan et al. | |
| 2013/0032920 A1 * | 2/2013 | Lin | H01L 27/14636 257/443 |
| 2013/0161825 A1 * | 6/2013 | Hsu | H01L 21/76898 257/774 |
| 2013/0341800 A1 | 12/2013 | Tu et al. | |
| 2014/0015122 A1 | 1/2014 | Chou et al. | |
| 2014/0045379 A1 | 2/2014 | Chen | |
| 2014/0048926 A1 | 2/2014 | Wang et al. | |
| 2014/0077356 A1 | 3/2014 | Chen et al. | |
| 2014/0183693 A1 | 7/2014 | Tsai et al. | |
| 2014/0187103 A1 | 7/2014 | Chen et al. | |
| 2014/0252558 A1 | 9/2014 | Yu et al. | |
| 2014/0252597 A1 | 9/2014 | Tsai et al. | |
| 2014/0252601 A1 | 9/2014 | Lu et al. | |
| 2014/0252608 A1 | 9/2014 | Chen et al. | |
| 2014/0262468 A1 | 9/2014 | Chen et al. | |
| 2014/0264885 A1 | 9/2014 | Tsai et al. | |
| 2016/0056196 A1 * | 2/2016 | Li | H01L 27/1464 257/435 |
| 2016/0225731 A1 * | 8/2016 | Chandolu | H01L 24/05 |

FOREIGN PATENT DOCUMENTS

| | | |
|---|---|---|
| KR | 20140029101 A | 3/2004 |
| KR | 20050032228 A | 4/2005 |
| KR | 100645213 B1 | 11/2006 |
| KR | 20120098844 A | 9/2012 |

* cited by examiner

FORMING BONDING STRUCTURES BY USING TEMPLATE LAYER AS TEMPLATES

PRIORITY CLAIM AND CROSS-REFERENCE

This application is a continuation of U.S. patent application Ser. No. 15/942,762, entitled "Forming Bonding Structures By Using Template Layer as Templates," filed on Apr. 2, 2018, which a divisional of U.S. patent application Ser. No. 14/885,719, entitled "Bonding Structures and Methods Forming the Same," filed on Oct. 16, 2015, now U.S. Pat. No. 9,935,047, issued on Apr. 3, 2018, which applications are incorporated herein by reference.

BACKGROUND

Metal-to-metal bonding (also sometimes referred to as direct bonding) and solder bonding are commonly used bonding methods in the packaging of integrated circuits. In the direct bonding, the bond pads of two wafers or chips are bonded together without solder disposed in between. For example, the direct bonding may be a copper-to-copper bonding or a gold-to-gold bonding. In a typical direct bonding process, the metal bumps of a device die are aligned to, and are placed against, the metal bumps of a package substrate. A pressure is applied to press the device die and the package substrate against each other. During the bonding process, the device die and the package substrate are also heated. With the pressure and the elevated temperature, the surface portions of the metal bumps of the device die and the package substrate inter-diffuse, so that bonds are formed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 16A illustrate the cross-sectional views of intermediate stages in the formation of a bond structure in accordance with some embodiments.

DETAILED DESCRIPTION

Figure 1:
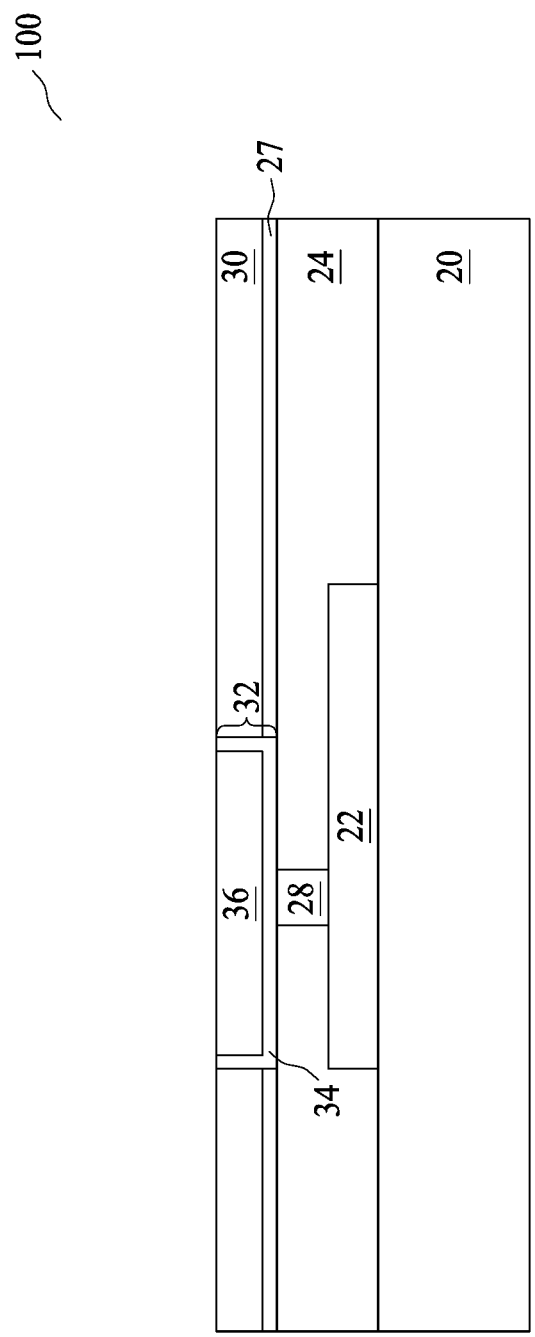

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Bond structures and the methods of forming the same are provided in accordance with various exemplary embodiments. The intermediate stages of forming the bond structure in accordance with some embodiments are illustrated. Some variations of some embodiments are discussed. Throughout the various views and illustrative embodiments, like reference numbers are used to designate like elements.

Figure 19:
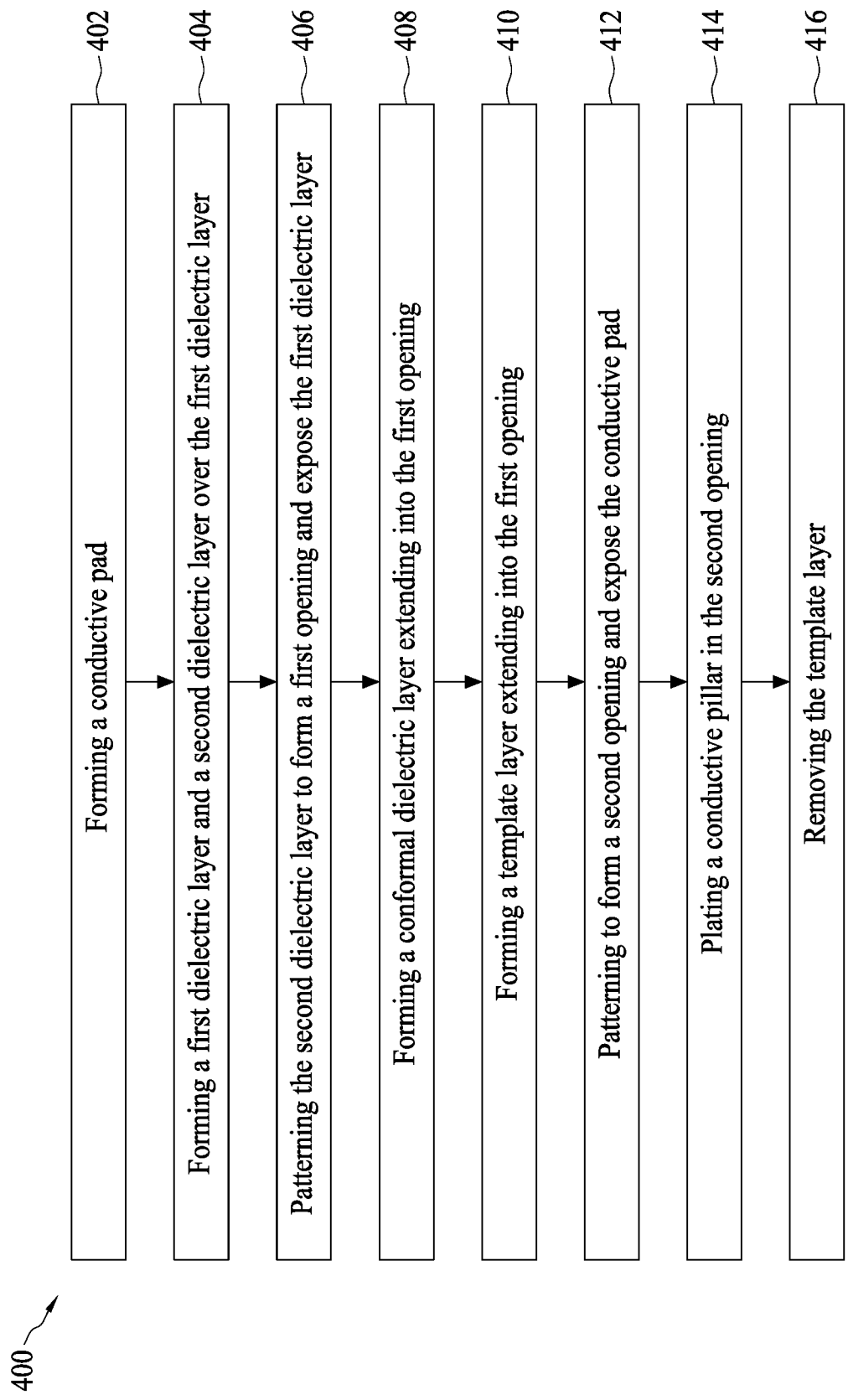
FIG. 19 illustrates a process flow for forming a bond structure in accordance with some embodiments.

FIGS. 1 through 16A illustrate the cross-sectional views of intermediate stages in the formation of a bond structure in accordance with some embodiments. The steps shown in FIG. 1 through 16A are also illustrated schematically in the process flow 400 as shown in FIG. 19. In the subsequent discussion, the process steps shown in FIGS. 1 through 16A are discussed referring to the process steps in FIG. 19.

FIG. 1 illustrates a cross-sectional view of package component 100. In accordance with some embodiments of the present disclosure, package component 100 is a device wafer including active devices such as transistors and/or diodes, and possibly passive devices such as capacitors, inductors, resistors, or the like. In accordance with alternative embodiments of the present disclosure, package component 100 is an interposer wafer, which may or may not include active devices and/or passive devices. In accordance with yet alternative embodiments of the present disclosure, package component 100 is a package substrate strip, which may be package substrates with cores therein or core-less package substrates. In subsequent discussion, a device wafer is used as an exemplary package component 100. The teaching of the present disclosure may also be applied to interposer wafers, package substrates, etc.

In accordance with some embodiments of the present disclosure, the exemplary wafer 100 includes semiconductor substrate 20 and the features formed at a top surface of semiconductor substrate 20. Semiconductor substrate 20 may comprise crystalline silicon, crystalline germanium, silicon germanium, and/or a III-V compound semiconductor such as GaAsP, AlInAs, AlGaAs, GaInAs, GaInP, GaInAsP, and the like. Semiconductor substrate 20 may also be a bulk silicon substrate or a Silicon-On-Insulator (SOI) substrate. Shallow Trench Isolation (STI) regions (not shown) may be formed in semiconductor substrate 12 to isolate the active regions in semiconductor substrate 20. Although not shown, through-vias may be formed to extend into semiconductor substrate 20, wherein the through-vias are used to electrically inter-couple the features on opposite sides of wafer 100.

In accordance with some embodiments of the present disclosure, wafer 100 includes integrated circuit devices 22, which are formed on the top surface of semiconductor substrate 20. Exemplary integrated circuit devices 22 include Complementary Metal-Oxide Semiconductor (CMOS) transistors, resistors, capacitors, diodes, and the like. The details of integrated circuit devices 22 are not illustrated herein. In accordance with alternative embodiments, wafer 100 is used for forming interposers, wherein substrate 20 may be a semiconductor substrate or a dielectric substrate.

Inter-Layer Dielectric (ILD) 24 is formed over semiconductor substrate 20 and fills the space between the gate stacks of transistors (not shown) in integrated circuit devices 22. In accordance with some exemplary embodiments, ILD 24 comprises phosphosilicate glass (PSG), borosilicate glass (BSG), boron-doped phosphosilicate glass (BPSG), fluorine-doped silicate glass (FSG), tetraethyl orthosilicate (TEOS), or the like. ILD 24 may be formed using spin coating, Flowable Chemical Vapor Deposition (FCVD), or the like. In accordance with alternative embodiments of the present disclosure, ILD 24 is formed using a deposition method such as Plasma Enhanced Chemical Vapor Deposition (PECVD), Low Pressure Chemical Vapor Deposition (LPCVD), or the like.

Figure 16A:
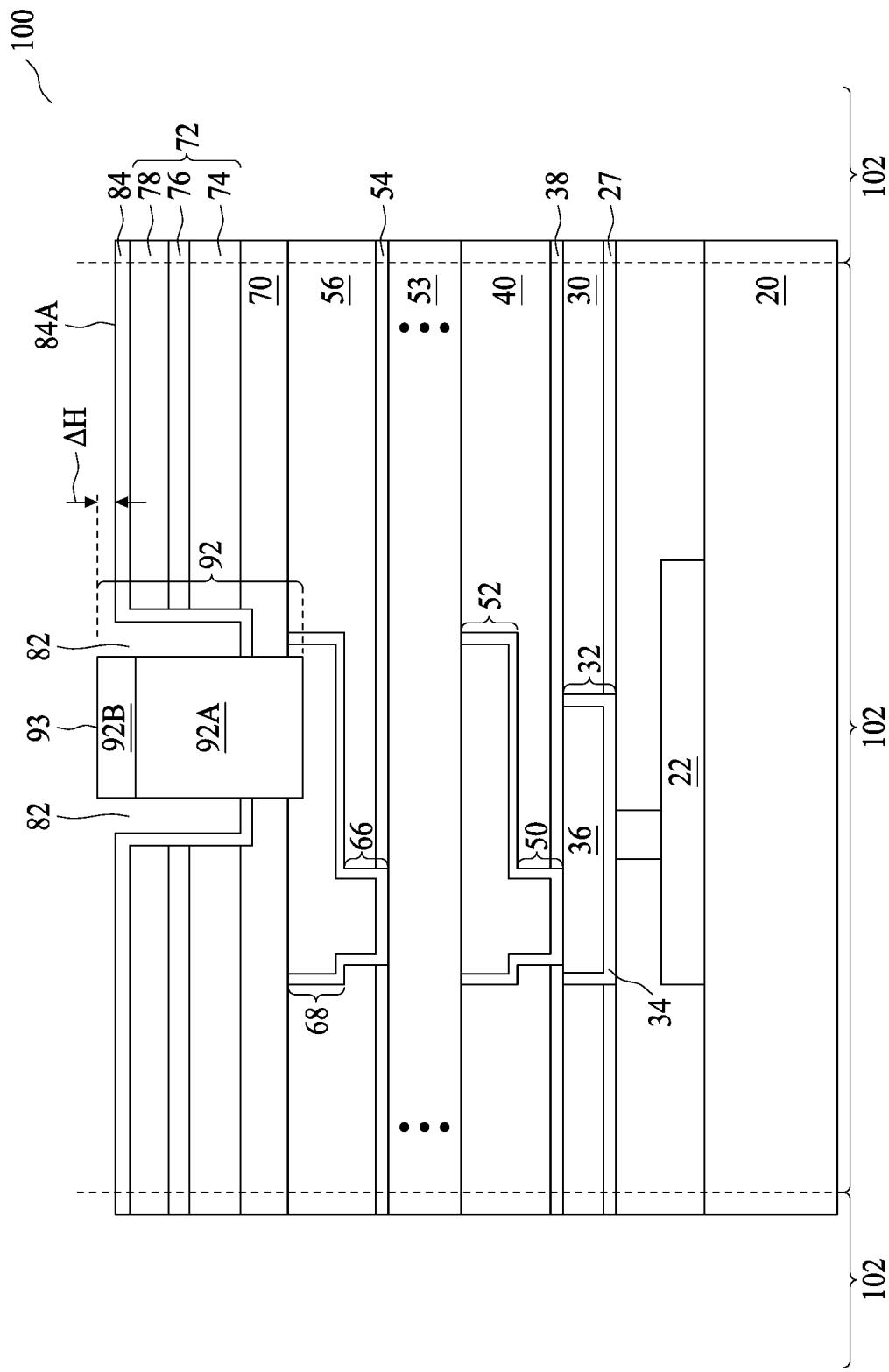

Contact plug 28 is formed in ILD 24, and is used to electrically connect integrated circuit devices 22 to overlying metal lines, vias, and conductive pillar 92 (FIG. 16A). In accordance with some embodiments of the present disclosure, contact plug 28 is formed of a conductive material selected from tungsten, aluminum, copper, titanium, tantalum, titanium nitride, tantalum nitride, alloys therefore, and/or multi-layers thereof. The formation of contact plug 28 may include forming an opening in ILD 24, filling a conductive material(s) into the contact opening, and performing a planarization (such as Chemical Mechanical Polish (CMP)) to level the top surface of contact plug 28 with the top surface of ILD 24.

As also shown in FIG. 1, etch stop layer 27 is formed over ILD 24 and integrated circuit devices 22, if any. Etch stop layer 27 may comprise silicon carbide, silicon nitride, silicon oxynitride, silicon carbo-nitride, or the like. Etch stop layer 27 is formed of a material that has a high etching selectivity relative to the overlying dielectric layer 30, and hence etch stop layer 27 may be used to stop the etching of dielectric layer 30.

Further illustrated in FIG. 1 is dielectric layer 30, which is alternatively referred to as Inter-Metal Dielectric (IMD) layer 30 hereinafter. In accordance with some embodiments of the present disclosure, IMD layer 30 is formed of a low-k dielectric material having a dielectric constant (k-value) lower than about 3.0, about 2.5, or even lower. IMD layer 30 may comprise Black Diamond (a registered trademark of Applied Materials), a carbon-containing low-k dielectric material, Hydrogen SilsesQuioxane (HSQ), MethylSilsesQuioxane (MSQ), or the like. IMD layer 30 may also have a low-k value, which may be lower than about 3.0, 2.5, or 2.0. In accordance with some embodiments of the present disclosure, the formation of IMD layer 30 includes depositing a porogen-containing dielectric material and then performing a curing process to drive out the porogen, and hence the remaining IMD layer 30 is porous.

In accordance with alternative embodiments, IMD layer 30 is formed of a non-low-k dielectric material such as silicon oxide, silicon nitride, silicon carbide, silicon oxynitride, or the like.

Conductive line 32 is formed in IMD layer 30. In accordance with some embodiments, metal line 32 includes diffusion barrier layers 34 and copper-containing material 36 over diffusion barrier layer 34. Diffusion barrier layer 34 may include titanium, titanium nitride, tantalum, tantalum nitride, or the like, and have the function of preventing copper in copper-containing material 36 from diffusing into IMD layer 30. Conductive line 32 is also referred to as metal line 32 hereinafter. The formation of conductive line 32 may include a single damascene process.

Figure 2:
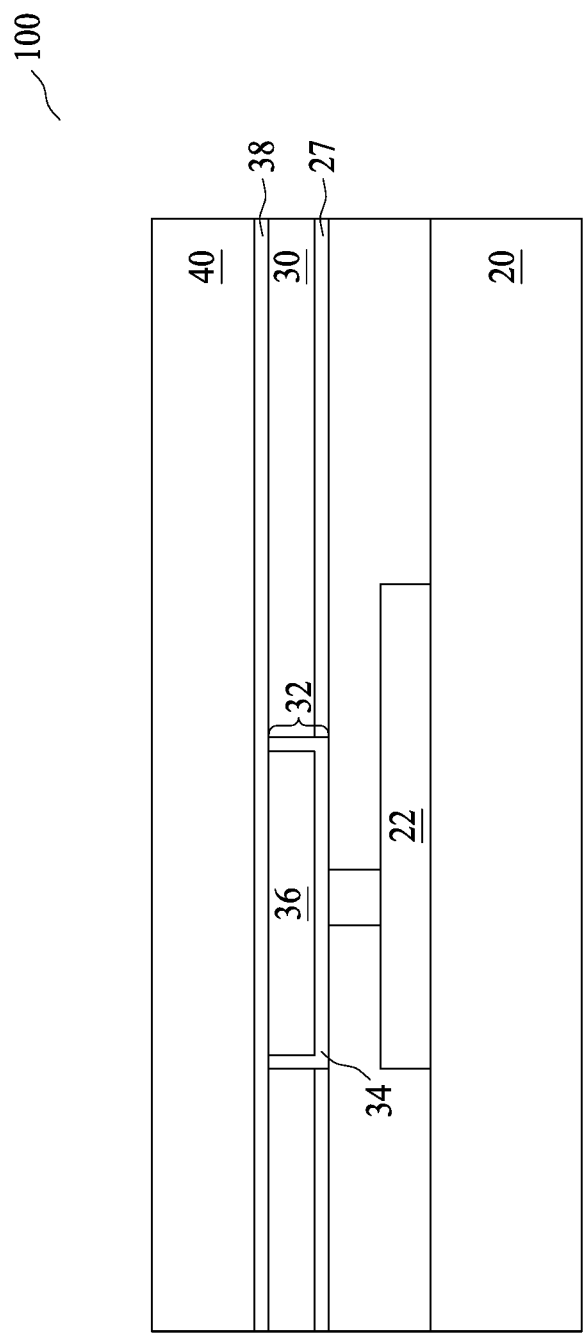

Referring to FIG. 2, etch stop layer 38 and IMD layer 40 are formed over IMD 30 and conductive line 32. In accordance with some embodiments of the present application, etch stop layer 38 is formed of a dielectric material selected from silicon carbide, silicon nitride, silicon oxynitride, silicon carbo-nitride, or the like. IMD layer 40 may be formed of a low-k material or a non-low-k material, and the material of IMD layer 40 may be selected from the same group of candidate materials for forming IMD 30.

Figure 3:
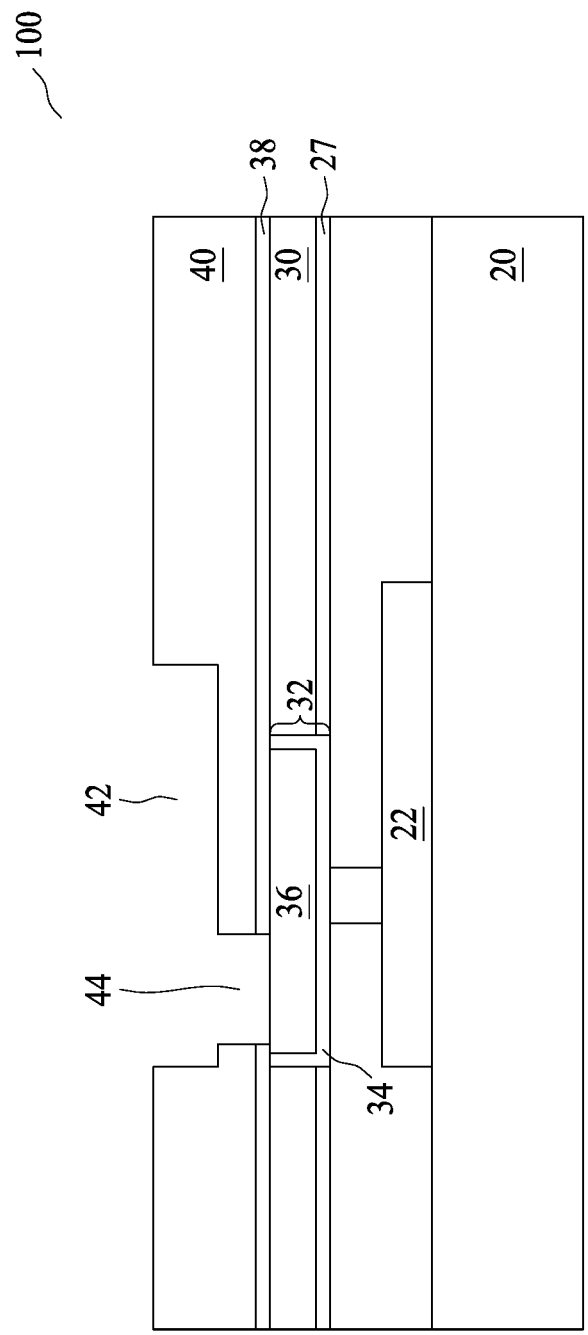

Referring to FIG. 3, trench 42 and via opening 44 are formed in IMD layer 40. In accordance with some embodiments of the present disclosure, the formation processes includes using a photo lithography process to etching IMD layer 40 in order to form an initial via opening, wherein the initial via opening extends from the top surface of IMD layer 40 to an intermediate level between the top surface and the bottom surface of IMD layer 40. Next, a metal hard mask (not shown) is formed and patterned to define the pattern of trench 42. An anisotropic etching is then performed to etch IMD layer 40 in order to form trench 42. At the same time trench 42 is formed, the initial via opening extends down to etch stop layer 38, hence forming via opening 44. The etching for forming trench 42 may be performed using a time-mode. In accordance with alternative embodiments, via opening 44 and trench 42 are formed in separate photo lithography processes. For example, in a first photo lithography process, via opening 44 is formed down to etch stop layer 38. In a second lithography process, trench 42 is formed. Etch stop layer 38 is then exposed to expose the underlying conductive line 32.

The etching of IMD layer 40 may be performed using a process gas comprising fluorine and carbon, wherein fluorine is used for etching, with carbon having the effect of protecting the sidewalls of the resulting via opening 44 and trench 42. For example, the process gases for the etching include a fluorine and carbon containing gas such as $C_4F_8$, $CH_2F_2$, and/or $CF_4$, and a carrier gas such as $N_2$. With an appropriate fluorine to carbon ratio, via opening 44 and trench 42 may have desirable profiles.

Figure 4:
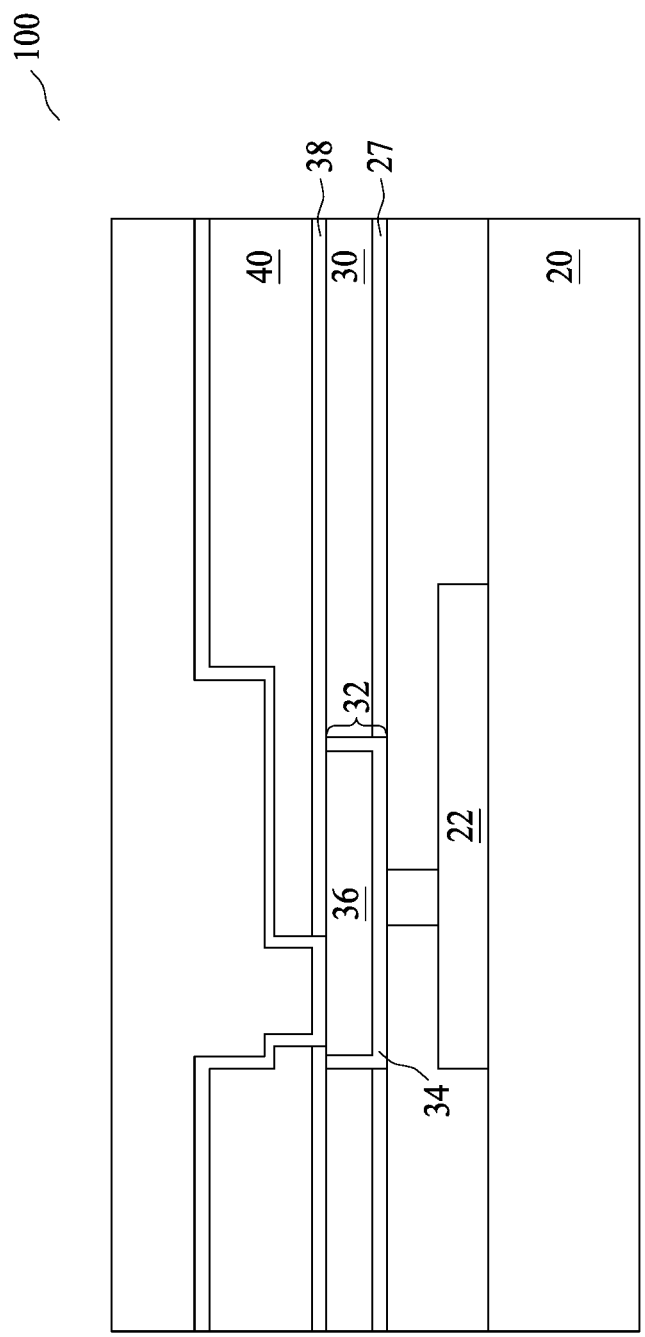
Figure 5:
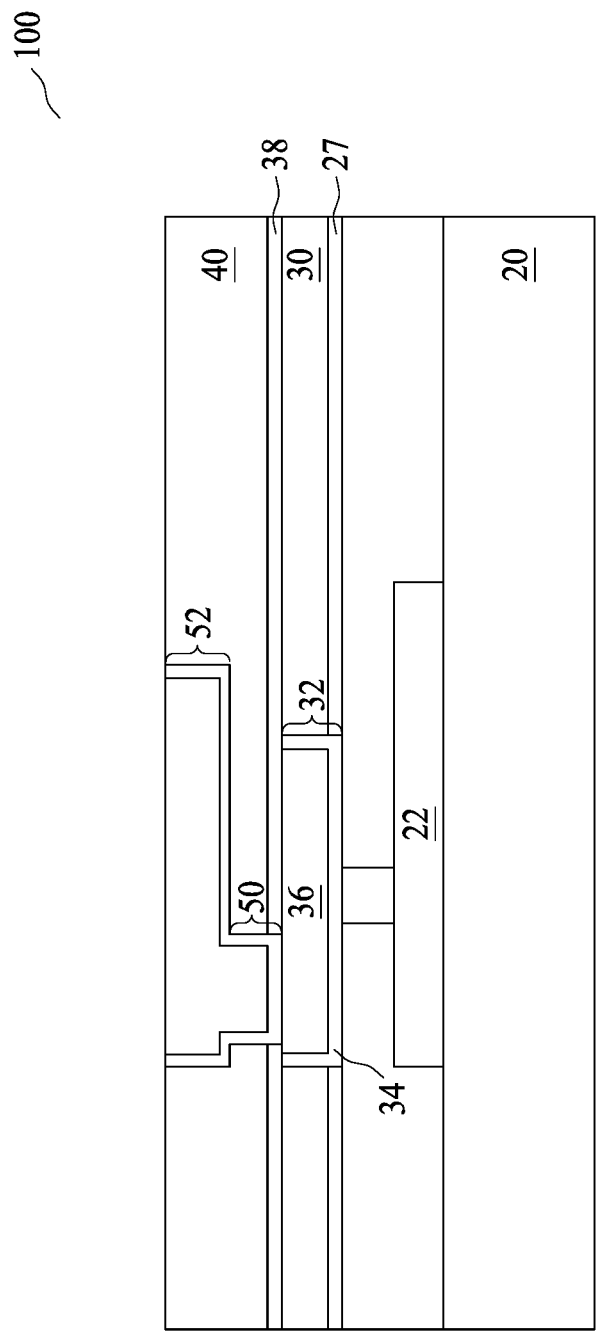

FIGS. 4 and 5 illustrate the formation of conductive via 50 in via opening 44 (FIG. 3), and conductive line 52 in trench 42. FIG. 4 illustrates an intermediate stage in the formation of conductive via 50 and conductive line 52. In accordance with some embodiments of the present disclosure, the formation of via 50 and conductive line 52 includes performing a blanket deposition to form conductive liner 46, depositing a thin seed layer (not shown) of copper or copper alloy, and filling the rest of via opening 44 and trench 42 by, for example, electro-plating, electro-less plating, deposition, or the like with conductive material 48. Conductive liner 46 may be a diffusion barrier layer, an adhesion layer, or the like. Conductive liner 46 may include titanium, titanium nitride, tantalum, tantalum nitride, or other alternatives. Conductive material 48 may include copper, a copper alloy, silver, gold, tungsten, aluminum, or the like. Next, as shown in FIG. 5, a planarization such as CMP is performed to level the surface of liner 46 and conductive material 48, and to remove excess materials from the top surface of IMD layer 40.

Figure 6:
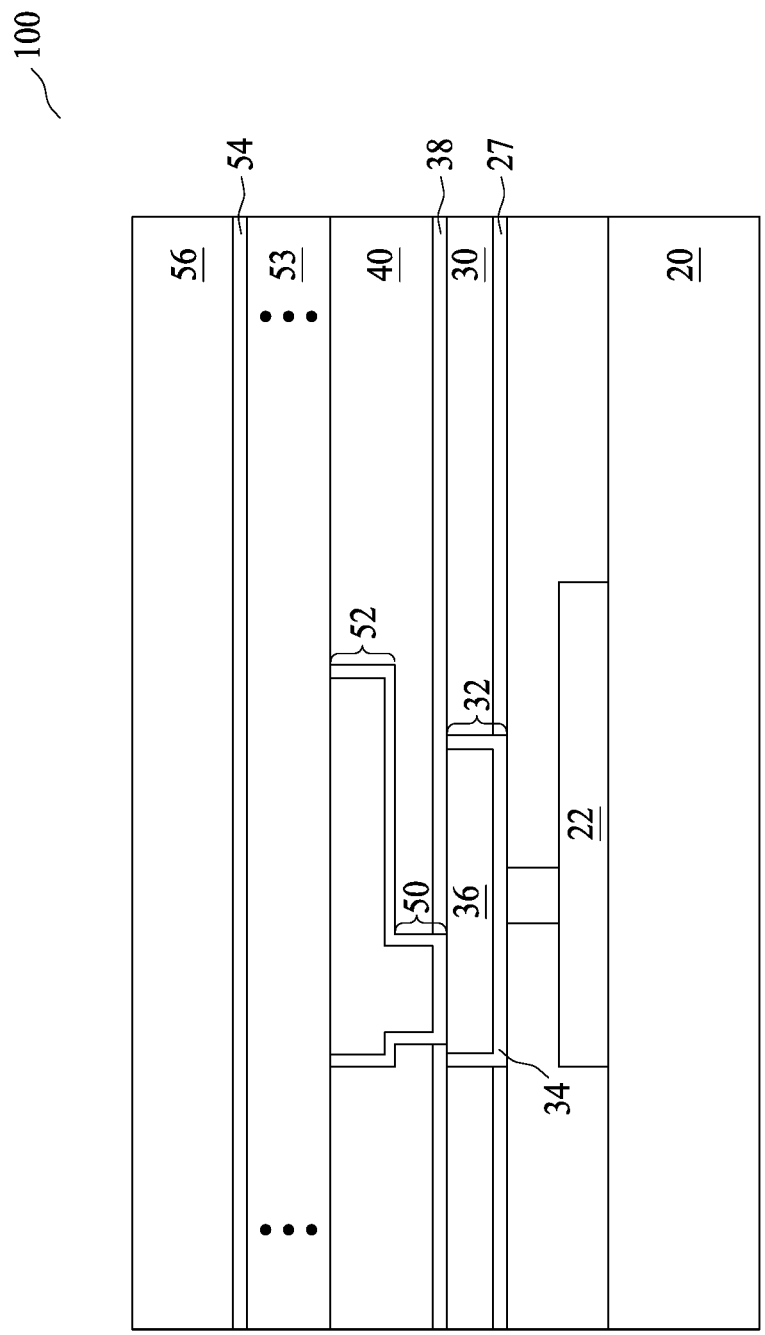

FIG. 6 schematically illustrates the formation of more dielectric (IMD) layers 53 and the respective conductive lines and vias (not shown) in dielectric layers 53. The number of IMD layers 53 is determined based on the routing requirement of the package component 100, and may range from 0 to 7 or more in accordance with some exemplary embodiments. The number of IMD layers 53 equaling to 0 means the subsequently formed etch stop layer 54 and dielectric layer 56 are formed directly over IMD layer 40 with no additional dielectric layer and conductive lines therebetween. The conductive lines and vias (not shown) in IMD layers 53 are electrically coupled to integrated circuit devices 22.

As also shown in FIG. 6, etch stop layer 54 and IMD layer 56 are formed over dielectric layers 53. In accordance with some embodiments of the present application, etch stop layer 54 is formed of a dielectric material selected from the same group of candidate materials for forming etch stop layer 27, wherein the candidate materials may include silicon carbide, silicon nitride, silicon oxynitride, silicon carbo-nitride, or the like. IMD layer 56 may also be formed of a low-k material or a non-low-k material, and the material of IMD layer 56 may be selected from the same group of candidate materials for forming IMDs 30 and 40.

Figure 7:
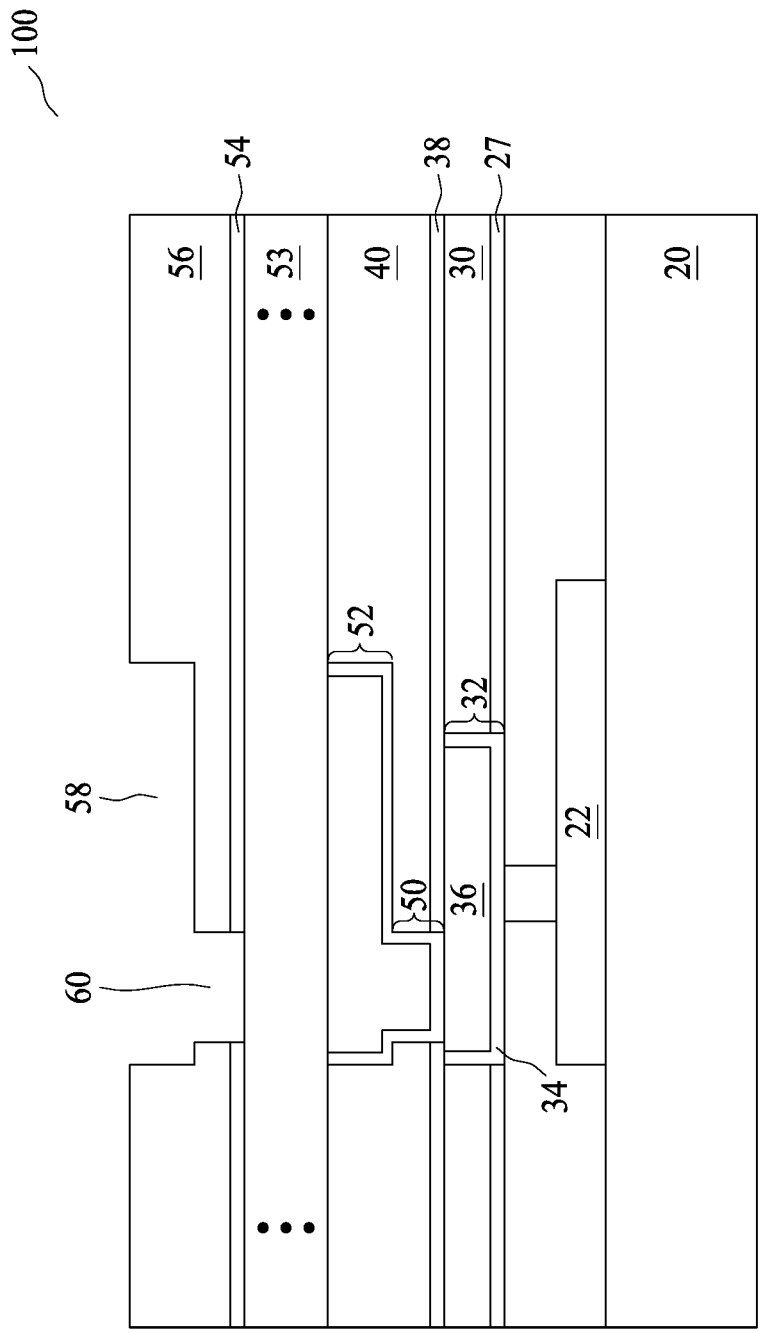
Figure 8:
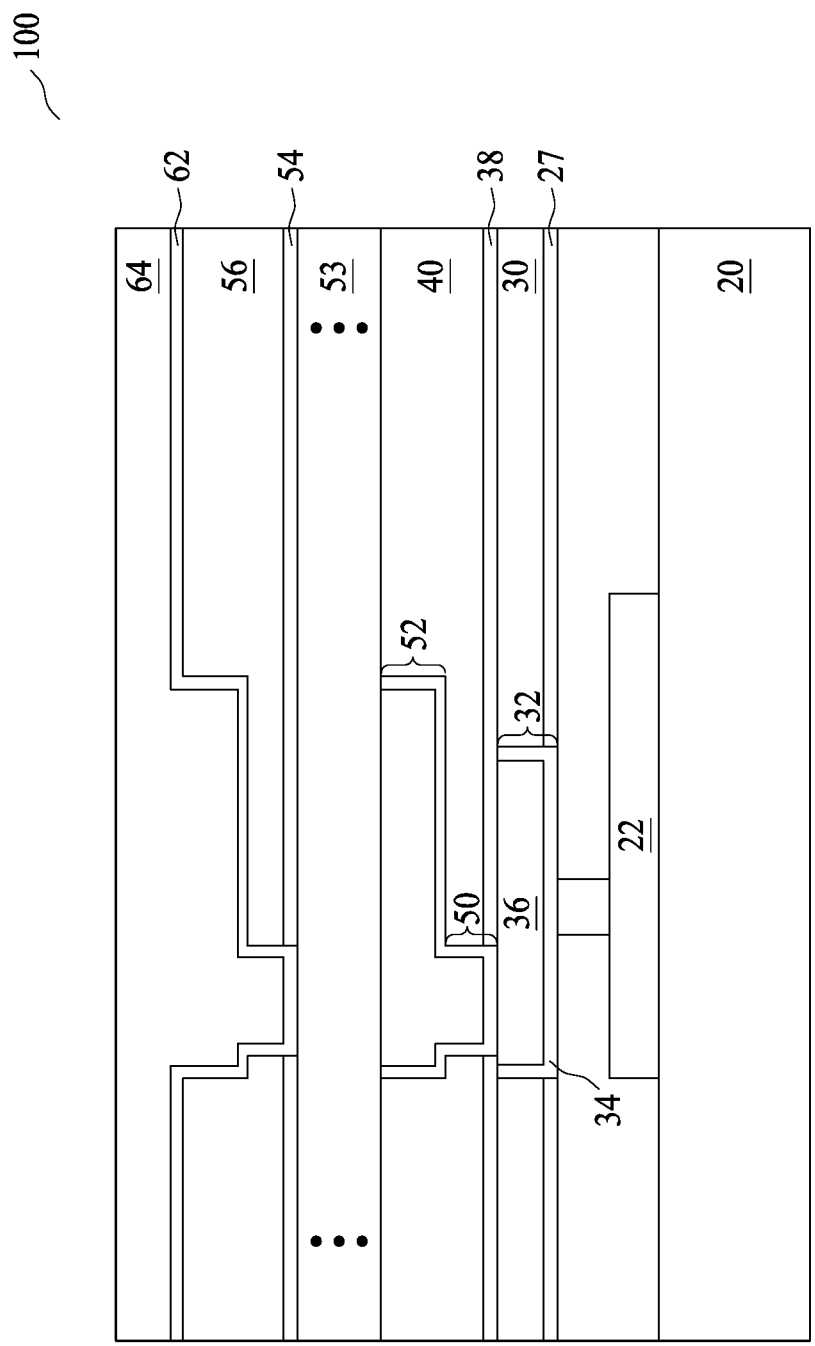
Figure 9:
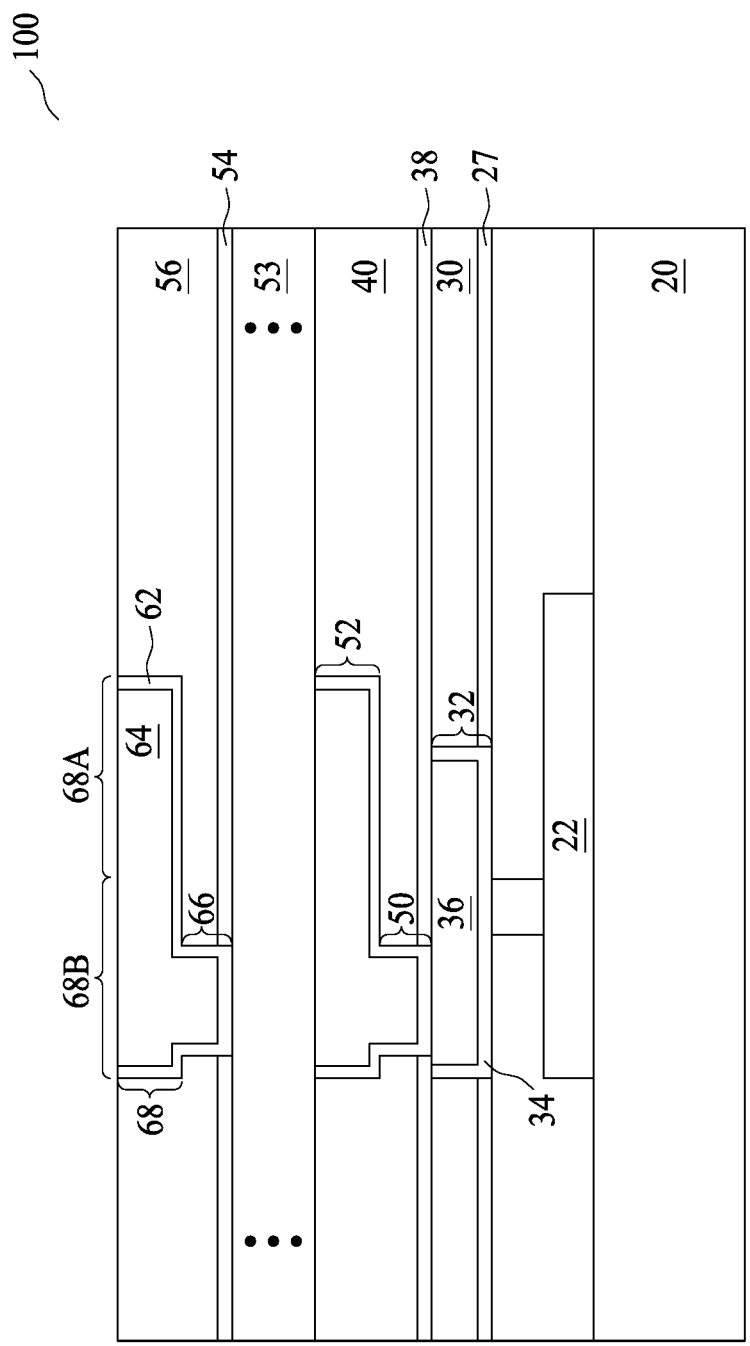

FIGS. 7 through 9 illustrate the formation of a conductive pad and the connecting via. The respective step is shown as step 402 in the process flow shown in FIG. 19. Referring to FIG. 7, trench 58 and via opening 60 are formed in IMD layer 56. The formation process may be the same as the formation of trench 42 and via opening 44 as shown in FIG. 3. In subsequent process steps, as shown in FIG. 8, conductive liner 62 is formed, followed by the filling of trench 58 and via opening 60 with conductive material 64. The materials of liner 62 and conductive material 64 may be selected from the candidate materials of the underlying liner 46 and conductive material 48 (FIG. 4), respectively. Next, a planarization process is performed to remove the portions of conductive liner 62 and conductive material 64 higher than the top surface of IMD layer 56, resulting in via 66 and conductive feature 68, as shown in FIG. 9. Via 66 and conductive feature 68 may be electrically coupled to integrated circuit devices 22.

Conductive feature 68 includes conductive pad 68A, and may include conductive line 68B connected to conductive pad 68A. Conductive pad 68A may be connected to via 66 through conductive line 68B, as shown in FIG. 9 in accordance with some exemplary embodiments. Conductive pad 68A may also have its bottom surface contacting the top surface of via 66 in accordance with some embodiments.

Figure 10:
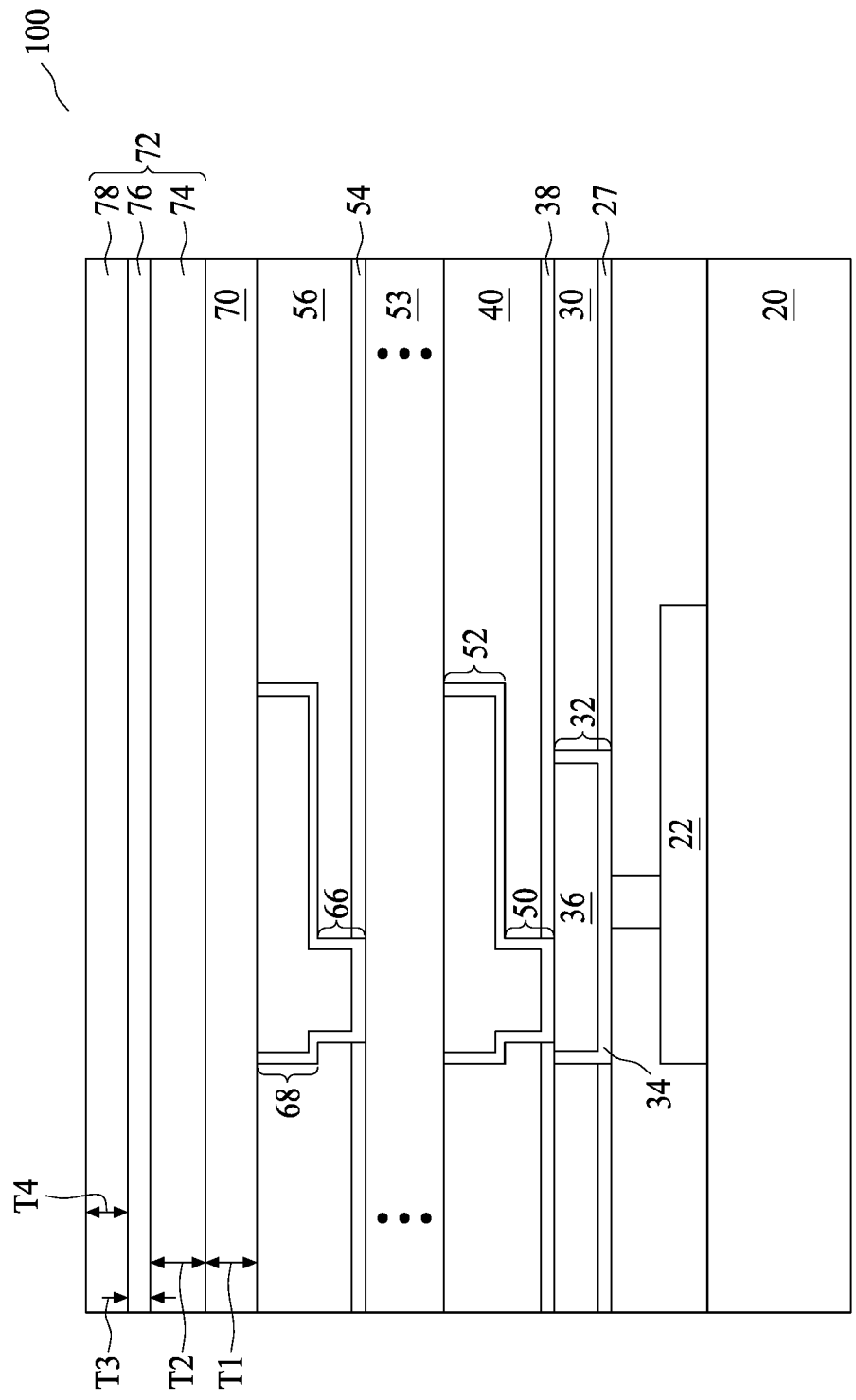

Referring to FIG. 10, dielectric layers 70 and 72 are formed. The respective step is shown as step 404 in the process flow shown in FIG. 19. In accordance with some exemplary embodiments, each of dielectric layers 70 and 72 is formed of a non-low-k dielectric material, which includes silicon nitride, silicon oxide, silicon carbide, silicon oxynitride, silicon carbo-nitride, combinations thereof, or multi-layers thereon. In accordance with some exemplary embodiments, dielectric layer 70 is formed of silicon nitride. Thickness T1 of dielectric layer 70 may be in the range between about 1,000 Å and about 3,000 Å. It is appreciated that the values recited throughout the description are examples, and different values may be used.

Dielectric layer 72 may be a single layer, or may be a composite layer including a plurality of (sub) dielectric layers. When dielectric layer 72 is a composite layer, the neighboring dielectric layers in dielectric layer 72 are formed of different dielectric materials. The number of dielectric layers in dielectric layer 72 may be 1, 2, 3 or more. In accordance with some exemplary embodiments, as illustrated in FIG. 10, dielectric layer 72 includes dielectric layer 74 over dielectric layer 70, dielectric layer 76 over dielectric layer 74, and dielectric layer 78 over dielectric layer 76. Dielectric layer 74 may be formed of silicon oxide ($SiO_2$) in accordance with some exemplary embodiments. Dielectric layer 76 may be formed of silicon nitride in accordance with some exemplary embodiments. Dielectric layer 78 may be formed of silicon oxide ($SiO_2$) in accordance with some exemplary embodiments. Thickness T2 of dielectric layer 74 may be in the range between about 1,000 Å and about 3,000 Å. Thickness T3 of dielectric layer 76 may be in the range between about 200 Å and about 1,000 Å. Thickness T4 of dielectric layer 78 may be in the range between about 2,000 Å and about 4,000 Å. Dielectric layers 70, 74, 76, and 78 may be formed as planar layers, which are planar throughout the entire package component 100. The formation method of layers 70, 74, 76, and 78 may be a Chemical Vapor Deposition (CVD) method such as Plasma Enhanced Chemical Vapor Deposition (PECVD) or Low Pressure Chemical Vapor Deposition (LPCVD).

Figure 11:
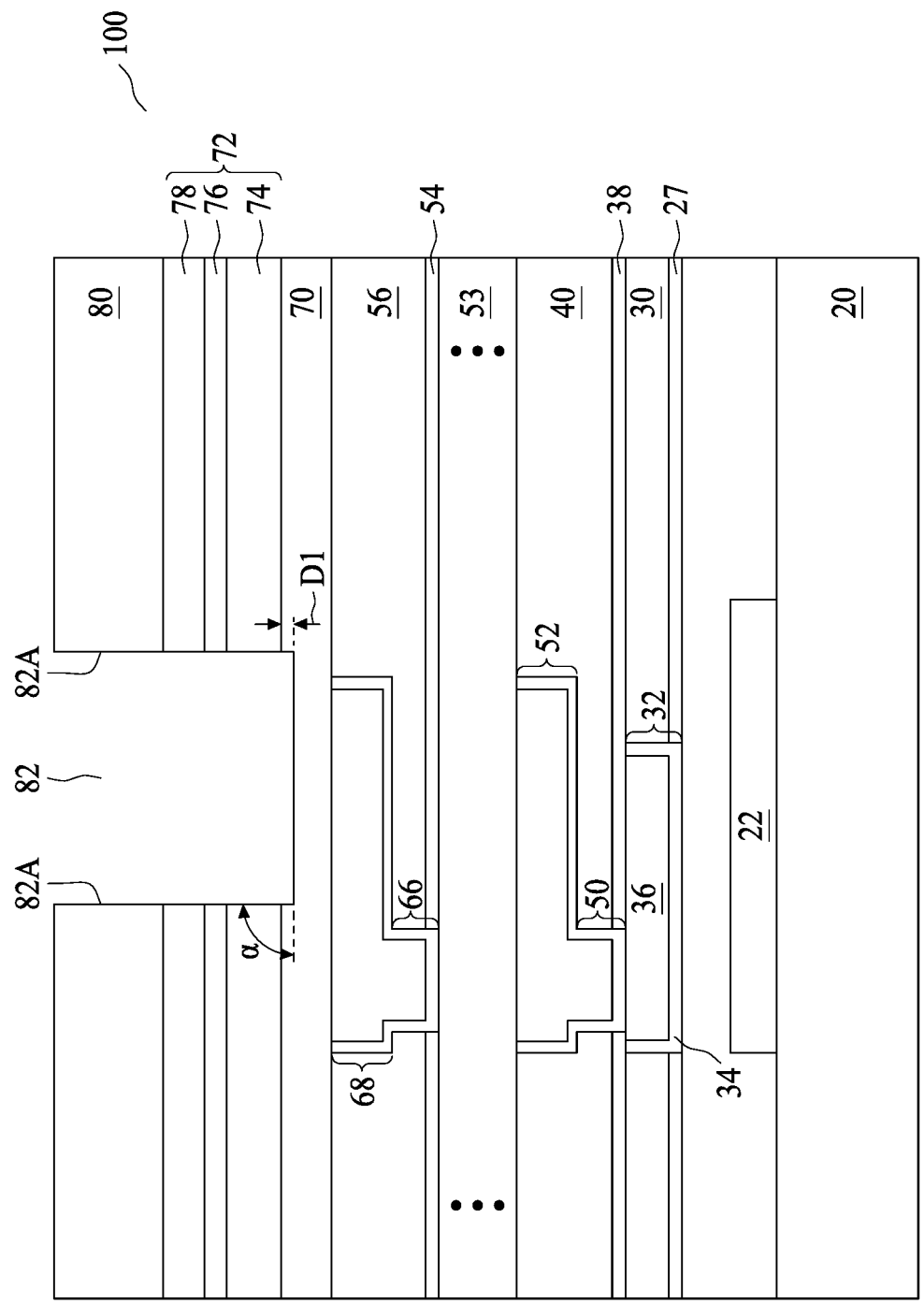

Referring to FIG. 11, photo resist 80 is formed over dielectric layer 72, and is patterned to form opening 82. Next, photo resist 80 is used as an etching mask to etch the underlying dielectric layer 72. The respective step is shown as step 406 in the process flow shown in FIG. 19. The etching is anisotropic, and may be performed using dry etching. The process gas for etching silicon oxide layers (such as layers 74 and 78) may include the mixed gas of ammonia ($NH_3$) and nitrogen trifluoride ($NF_3$), which is known as SiCoNi™. The process gases for etching silicon nitride may include the mixture of $CF_4$ and $H_2$, the mixture of $CF_4$, $O_2$, and $N_2$, the mixture of $SF_6$, $O_2$, and $N_2$, the mixture of $SF_6$, $CH_4$, and $N_2$, or the mixture of $SF_6$, $CH_4$, $N_2$, and $O_2$. The composition of the process may also be adjusted so that there is an adequate etching selectivity, for example, greater than about 30, so that dielectric layer 70 is not etched through. As a result of the etching, opening 82 penetrates through dielectric layer 72, and extends slightly into dielectric layer 70, as shown in FIG. 11. Opening 82 may extend into dielectric layer 70 for depth D1 greater than about 50 Å in some embodiments.

The sidewalls 82A of opening 82 are substantially vertical, for example, with title angle α of sidewall 82A being between about 85 degrees and about 90 degrees in accordance with some embodiments. After the formation of opening 82, photo resist 80 is removed.

Figure 12:
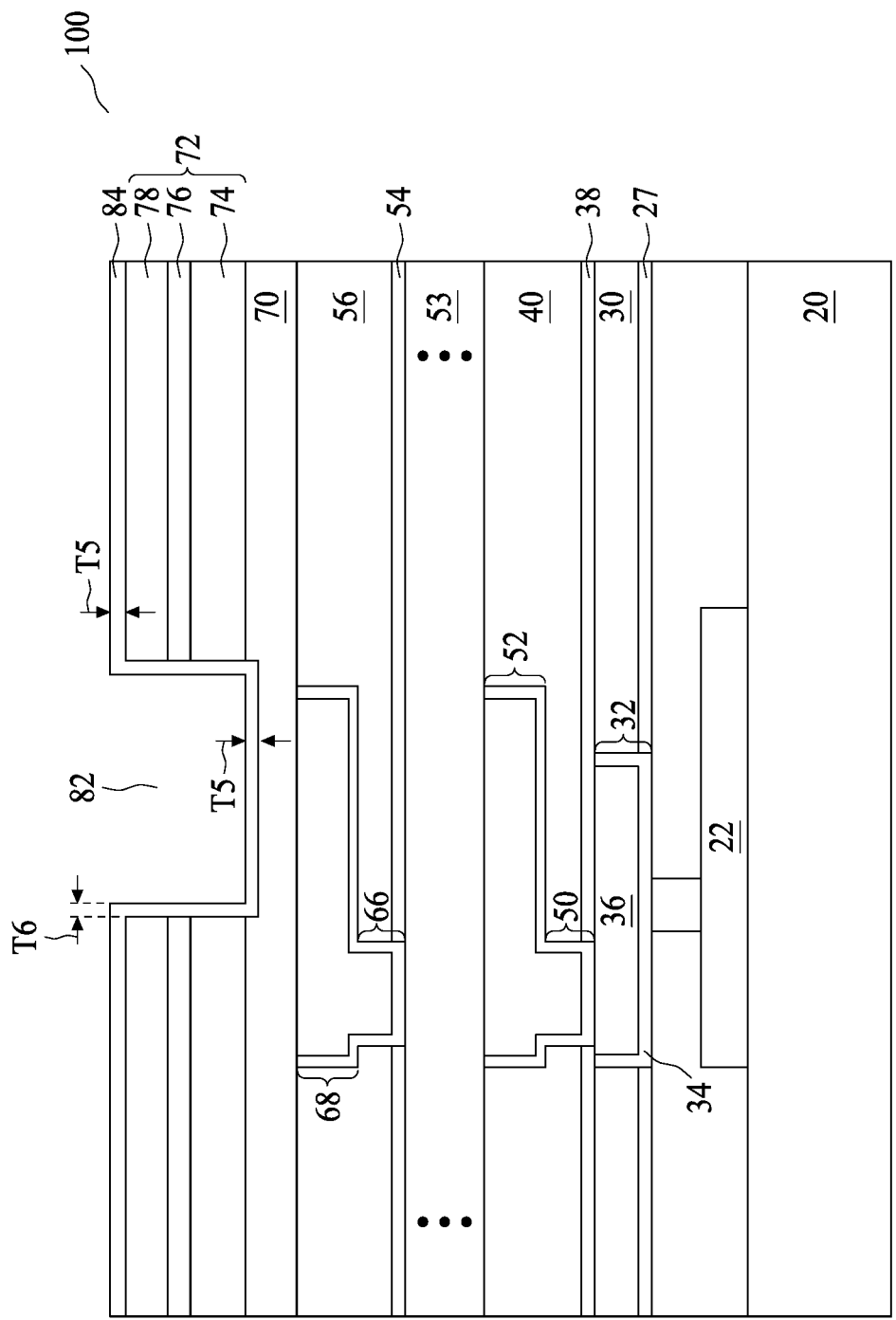

Next, as shown in FIG. 12, dielectric layer 84 is formed. The respective step is shown as step 408 in the process flow shown in FIG. 19. Dielectric layer 84 has first portions over dielectric layer 72 and second portions extending into opening 82. Dielectric layer 84 may be a conformal layer that has horizontal portions and vertical portions having the same thickness, or substantially the same thickness. For example, thicknesses T5 of horizontal portions and thickness T6 of the vertical portions may have difference (T5−T6), and ratio (T5−T6)/T5 may be smaller than about 0.2, or smaller about 0.1 in accordance with some embodiments. Dielectric layer 84 may be formed using a conformal deposition method such as Atomic Layer Deposition (ALD). The thicknesses T5 and T6 of dielectric layer 84 may be in the range between about 100 Å and about 300 Å, for example. In accordance with some exemplary embodiments, dielectric layer 84 comprises aluminum oxide ($Al_2O_3$).

Figure 13:
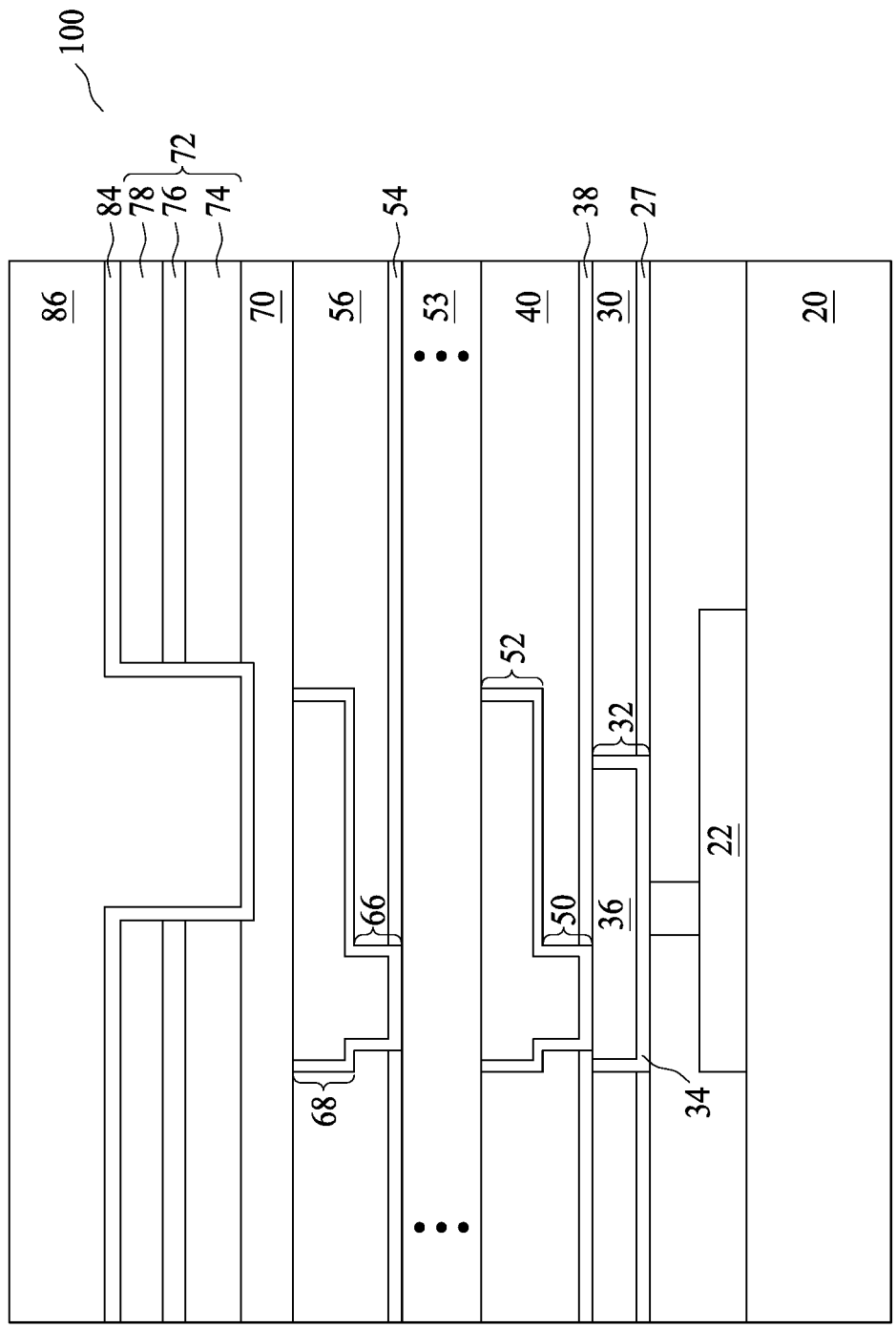

Referring to FIG. 13, template layer 86 is formed to fill opening 82 (FIG. 12). The respective step is shown as step 410 in the process flow shown in FIG. 19. The top surface of template layer 86 is higher than the top surface of dielectric layer 84. Template layer 86 may be formed of silicon oxide, which may be formed using precursors such as TEOS and ozone. The formation method may include PECVD, Sub-Atmospheric Chemical Vapor Deposition (SACVD), or the like. A planarization step such as CMP may be performed to level the top surface of template layer 86.

Figure 14:
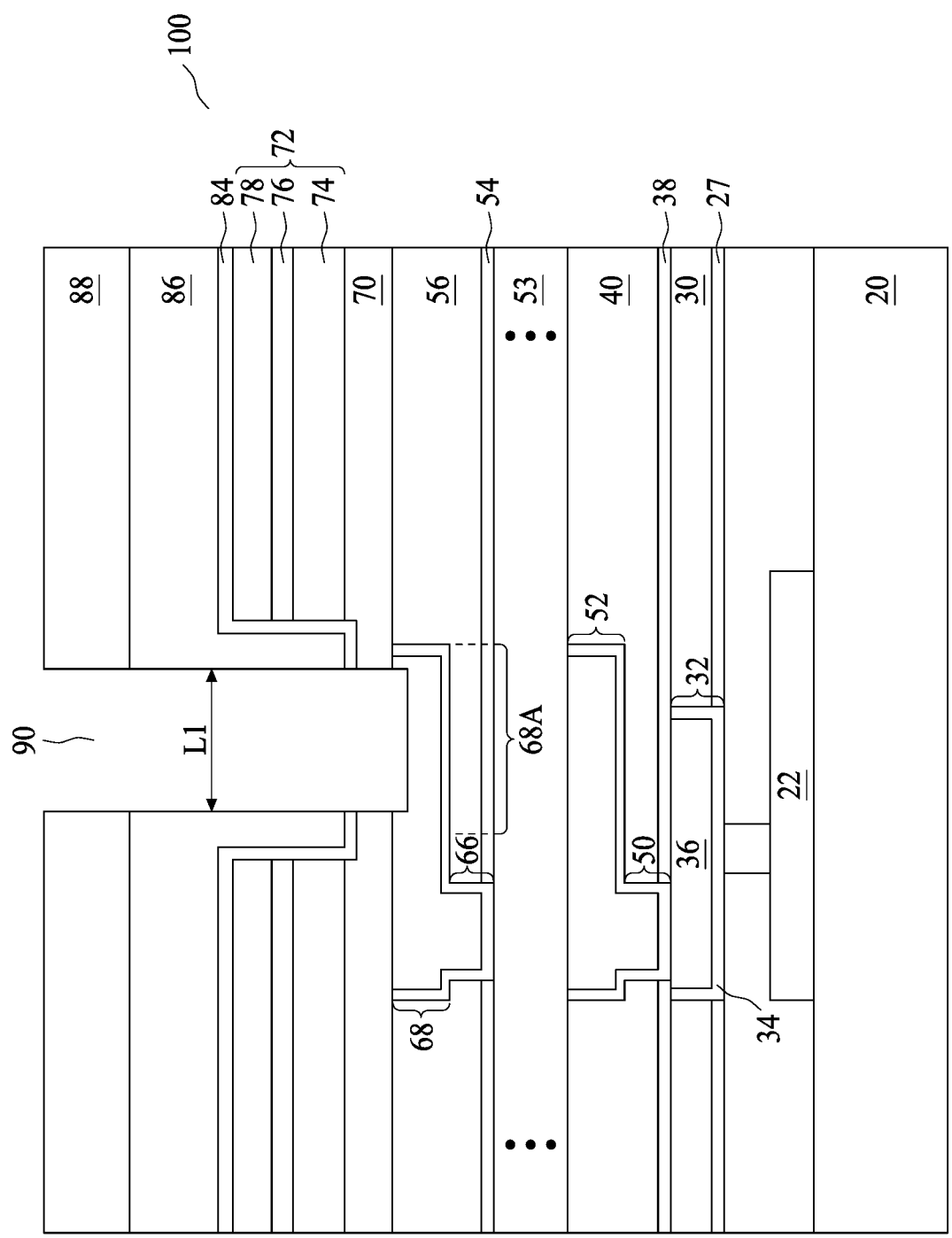

Referring to FIG. 14, photo resist 88 is formed over template layer 86, and is patterned. Next, photo resist 88 is used as an etching mask to etch the underlying template layer 86, dielectric layer 84, and dielectric layer 70 to form opening 90. The respective step is shown as step 412 in the process flow shown in FIG. 19. As a result, conductive pad 68A is exposed. The etching is anisotropic, and may be performed using dry etching. The process gas for etching template layer 86 may also include SiCoNi™ in accordance with some embodiments. The process gases for etching aluminum oxide (layer 84) may include the mixture of $O_2$, $BCl_3$ and Ar. As a result of the etching, opening 90 penetrates through layers 86, 84, and 70, and may extend slightly into conductive pad 68A. The lateral dimension L1 of opening 90 is small, for example, smaller than about 3 μm. In the case wherein there is undercut (which is caused by different etching rates of different materials responding to the same etchant) in dielectric layer 70, the undercut is controlled to be smaller than about 0.5 μm.

Figure 15:
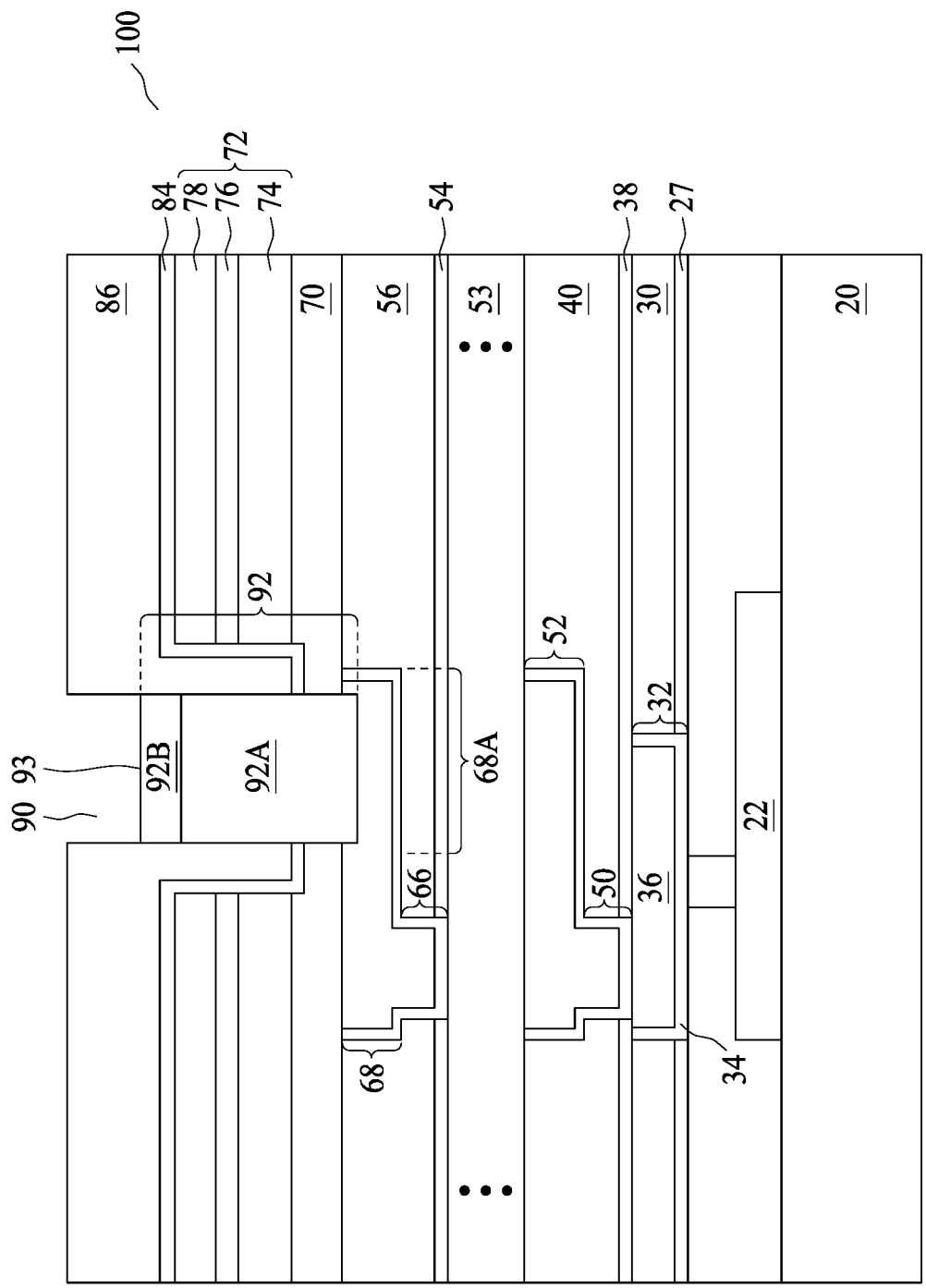

Photo resist 88 is then removed, and the resulting structure is shown in FIG. 15. Next, using template layer 86 as a template, conductive pillar 92 is formed in opening 90, for example, by electrical-Chemical plating or electro-less plating. The respective step is shown as step 414 in the process flow shown in FIG. 19. Since conductive pad 68A acts as a seed layer for the plating, there is no blanket seed layer formed in accordance with some embodiments. Conductive pillar 92 may be a metal pillar, and may have a single-layer structure or a multi-layer structure. The material of Conductive pillar 92 may be selected from Cu, Ni, Pd, Au, Sn, SnAg, Co, combinations thereof, and multi-layers thereof. In accordance with some exemplary embodiments, conductive pillar 92 includes nickel layer 92A and gold layer 92B over nickel layer 92A.

Template layer 86 is then removed, leaving conductive pillar 92, as shown in FIG. 16A. The respective step is shown as step 416 in the process flow shown in FIG. 19. Conductive pillar 92 has a portion, which may be a majority, in opening 82, and a portion higher than top surface 84A of dielectric layer 84. The top surface 93 of conductive pillar 92 and top surface 84A of layer 84 have height difference ΔH, which may be smaller than about 5,000 Å. Height difference ΔH may also be in the range between about 2,000 Å and about 5,000 Å.

Figure 16B:
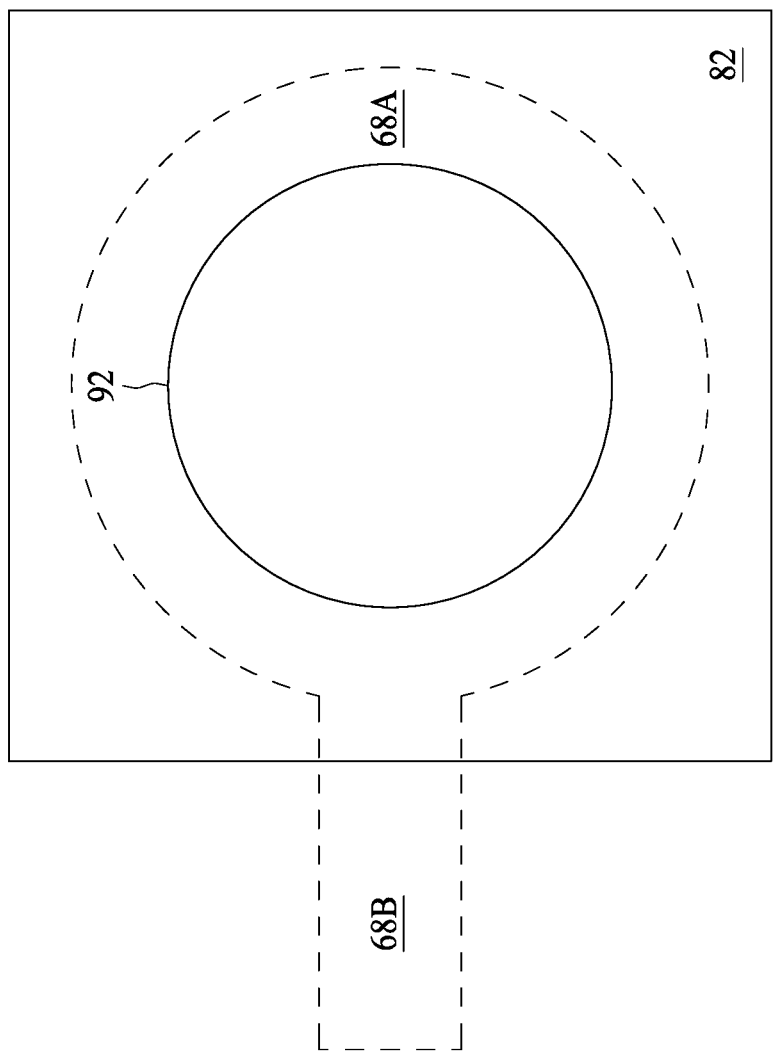
FIG. 16B illustrates a top view of a conductive pillar and the surrounding opening in accordance with some embodiments.

FIG. 16B illustrates a top view of the bond structure in FIG. 16A. FIG. 16B shows that conductive pillar 92 is encircled by opening 82. Furthermore, conductive pillar 92 lands on conductive pad 68A, with conductive pad 68A expanding beyond the edges of conductive pillar 92. In subsequent processes, wafer 100 as shown in FIG. 16A may be sawed into dies 102, or remain as an un-sawed wafer in subsequent steps.

Figure 17:
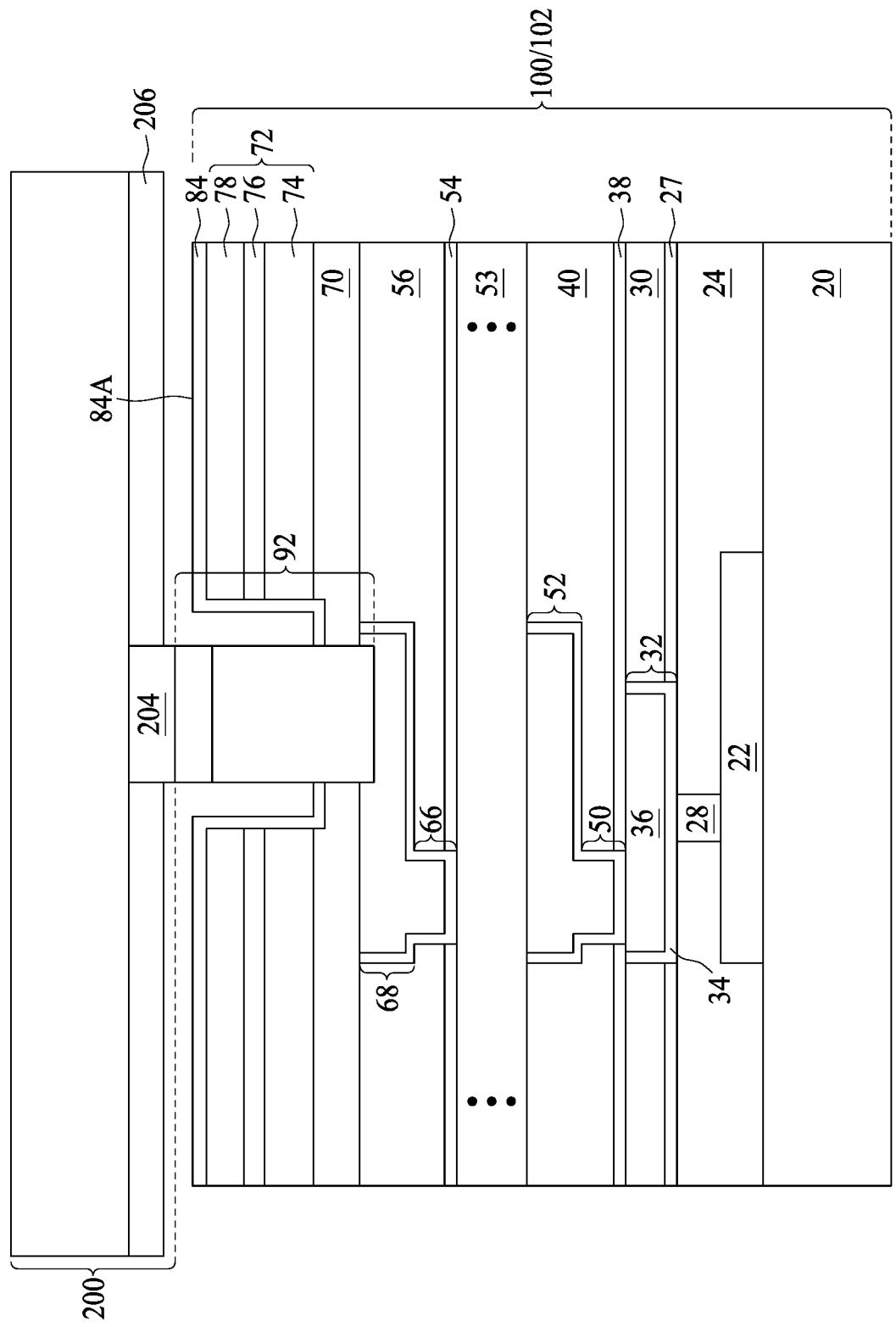
FIG. 17 illustrates the conductive pillar in contact with a conductive feature of another package component in accordance with some embodiments.

FIG. 17 illustrates die 102 or wafer 100 (referred to as die/wafer 102/100 hereinafter) put into contact with package component 200. Package component 200 may be a device die or wafer, an interposer die or wafer, a package substrate, or a package. Conductive pillar 92 may be in physical contact with metal feature 204 at the surface of package component 200. With conductive pillar protruding higher than surface 84A of dielectric layer 84, dielectric layer 84 is spaced apart from dielectric layer 206 in package component 200.

The contacting of die 102 or wafer 100 with package component 200 may be performed for testing the circuits in die/wafer 102/100 and package component 200 jointly in accordance with exemplary embodiments. In a subsequent step, die/wafer 102/100 is separated from package component 200. Since dielectric layer 84 is not in physical contact with dielectric layer 206, there is no sticking force preventing die/wafer 102/100 from being separated from package component 200.

Figure 18:
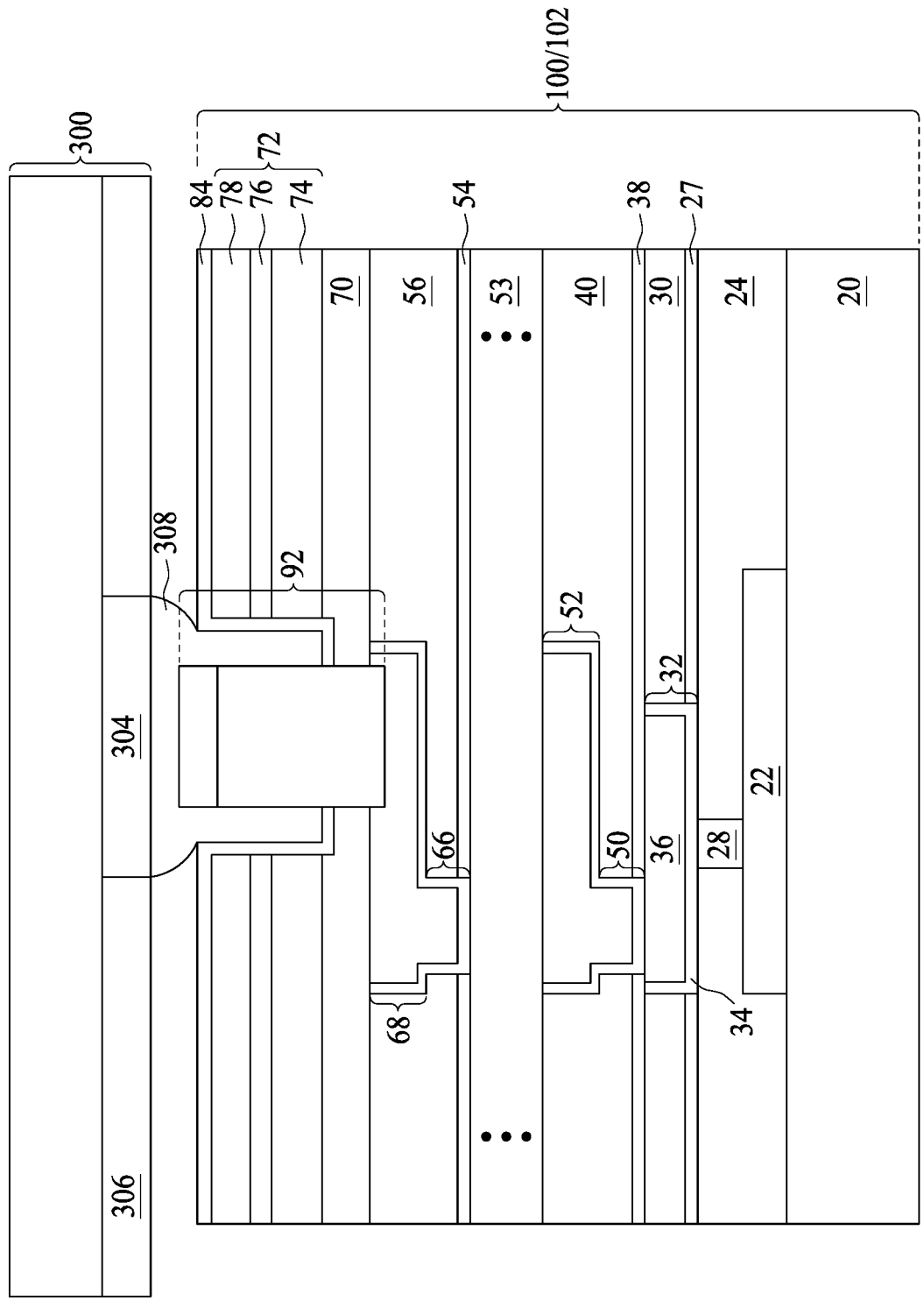
FIG. 18 illustrates the conductive pillar bonded to a conductive feature of another package component through solder bonding in accordance with some embodiments.

FIG. 18 illustrates a step wherein die/wafer 102/100 is bonded to package component 300, which may be a device die/wafer, an interposer die/wafer, a package substrate, or a package. In accordance with some embodiments, solder region 308 bonds conductive pillar 92 to conductive feature 304 in package component 300. Dielectric layer 84 may also be spaced apart from surface dielectric layer 306 in package component 300 in accordance with some embodiments. The space between die/wafer 102/100 and package component 300 maybe filled with underfill (not shown), or remain as unfilled in the final product (when it used). Solder region 308 may fully or partially fill opening 82 (FIGS. 16A and 16B) in accordance with some embodiments. Solder region 308 may contact the sidewalls of conductive pillar 92.

The embodiments of the present disclosure have some advantageous features. By using a template layer as a plating template to form conductive pillars, there is no need to use photo resist as the plating template. Accordingly, the lateral dimension of the conductive pillar may be significantly reduced, for example, to smaller than about 3 μm, which cannot be achieved if conductive pillars are formed using photo resist as the plating template. Furthermore, no seed layer is needed for the plating of the conductive pillar, and hence the removal of unwanted portions of the seed layer is no longer needed. In addition, by forming the conductive pillar in an opening, the conductive pillar is protected from the contamination of particles, for example, in the step shown in FIG. 17, and protected from likely mechanical damage.

In accordance with some embodiments of the present disclosure, a method includes forming a first dielectric layer over a conductive pad, forming a second dielectric layer over the first dielectric layer, and etching the second dielectric layer to form a first opening, with a top surface of the first dielectric layer exposed to the first opening. A template layer is formed to fill the first opening. A second opening is then formed in the template layer and the first dielectric layer, with a top surface of the conductive pad exposed to the second opening. A conductive pillar is formed in the second opening.

In accordance with some embodiments of the present disclosure, a method includes forming a first dielectric layer over a conductive pad, with the first dielectric layer being a planar layer, forming a second dielectric layer over the first dielectric layer, with both the first dielectric layer and the second dielectric layer being planar layers, and etching the second dielectric layer to form a first opening. The etching the second dielectric layer stops when a top surface of the first dielectric layer is exposed. The method further includes forming a conformal dielectric layer extending into the first opening, forming a template layer filling the first opening and over the conformal dielectric layer, and forming a patterned photo resist over the template layer. The template layer, the conformal dielectric layer, and the first dielectric layer are etched to form a second opening. A conductive pillar is plated in the second opening, with the conductive pillar connected to the conductive pad. The template layer is then removed.

In accordance with some embodiments of the present disclosure, a structure includes a conductive pad, a first dielectric layer over the conductive pad, and a second dielectric layer over the first dielectric layer. A conformal dielectric layer extends into an opening in the second dielectric layer. The conformal layer has sidewall portions on sidewalls of the opening, and a bottom portion contacting a top surface of the first dielectric layer. A conductive pillar penetrates through the bottom portion of the conformal dielectric layer and the first dielectric layer. The conductive pillar is in contact with the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a conductive pad over a substrate;
   forming a first dielectric layer over the conductive pad;
   forming a second dielectric layer over the first dielectric layer;
   patterning the second dielectric layer to form a first opening, in a plan view the first opening having a square shape;
   forming a dielectric liner over the second dielectric layer and within the first opening to form a second opening;
   filling the second opening with a template layer;
   patterning the template layer to form a third opening, in the plan view the third opening having a round shape; and
   forming a conductive pillar in the third opening.

2. The method of claim 1, wherein patterning the second dielectric layer further comprises etching a portion of the first dielectric layer.

3. The method of claim 1, wherein patterning the template layer further comprises etching the first dielectric layer.

4. The method of claim 3, wherein patterning the template layer further comprises exposing the conductive pad.

5. The method of claim 1, wherein the conductive pad is embedded in a low-k dielectric layer.

6. The method of claim 1, wherein the dielectric liner comprises:
   a first horizontal portion contacting the first dielectric layer;
   a second horizontal portion contacting an upper surface of the second dielectric layer; and
   a sidewall portion connecting the first horizontal portion to the second horizontal portion.

7. The method of claim 1 further comprising, after forming the conductive pillar, removing the template layer.

8. The method of claim 7 further comprising, after removing the template layer, bonding the conductive pillar to a package component using a solder joint.

9. The method of claim 8, wherein in the plan view the solder joint comprises a square shape bounded by the dielectric liner.

10. A method comprising:
    forming a first package component, comprising:
        embedding a conductive pad in a low-k dielectric layer;
        forming a first dielectric layer over the conductive pad;
        forming second dielectric layers over the first dielectric layer;
        etching a first opening in the first dielectric layer and the second dielectric layers, an upper surface of the first dielectric layer being exposed;
        depositing a dielectric liner in the first opening and over the first dielectric layer and the second dielectric layers; and
        forming a conductive pillar in the first opening, a sidewall of the conductive pillar contacting a horizontal portion of the dielectric liner, the sidewall of the conductive pillar being spaced apart from a sidewall portion of the dielectric liner; and
    attaching a second package component to the first package component.

11. The method of claim 10, wherein the second package component comprises a metal pad, and wherein the attaching the second package component comprises bonding the metal pad to the conductive pillar.

12. The method of claim 10, wherein the second package component comprises a conductive feature at least partially embedded in a surface dielectric layer, and wherein the attaching the second package component comprises forming a solder region between the conductive feature and the conductive pillar.

13. The method of claim 10, wherein the etching the first opening exposes a sidewall of each of the second dielectric layers.

14. The method of claim 10 further comprising, before forming the conductive pillar:
    depositing a template layer in the first opening; and
    etching a second opening in the template layer.

15. The method of claim 14, wherein the second opening exposes the horizontal portion of the dielectric liner.

16. The method of claim 14, wherein the second opening exposes the conductive pad.

17. A method comprising:
    forming a conductive pad in a low-k dielectric layer, a first upper surface of the conductive pad being level with the low-k dielectric layer;
    forming a first dielectric layer over the conductive pad;
    forming a second dielectric layer over the first dielectric layer;
    patterning a first opening through the first dielectric layer and the second dielectric layer, the first opening extending partially into the first dielectric layer;
    forming a template layer in the first opening;
    patterning a second opening through the template layer, the second opening extending partially into the conductive pad, a second upper surface of the conductive pad being below the first upper surface;
    forming a conductive pillar in the second opening; and
    removing the template layer.

18. The method of claim 17 further comprising, after removing the template layer, forming a solder region over an upper surface and around sidewalls of the conductive pillar.

19. The method of claim 18, wherein in a first plan view a first inner surface of the solder region physically contacting the sidewalls of the conductive pillar comprises a first round shape, and wherein in the first plan view a first outer surface of the solder region comprises a square shape.

20. The method of claim 19, wherein the conductive pillar comprises an upper portion above the second dielectric layer, and wherein a second outer surface of the upper portion of the solder region has a greater width than the first inner surface of the solder region.

\* \* \* \* \*